(12) United States Patent
Oh

(10) Patent No.: US 7,713,799 B2
(45) Date of Patent: May 11, 2010

(54) METHOD OF FORMING PATTERN HAVING STEP DIFFERENCE AND METHOD OF MAKING THIN FILM TRANSISTOR AND LIQUID CRYSTAL DISPLAY USING THE SAME

(75) Inventor: Tae Young Oh, Anyang-si (KR)

(73) Assignee: LG. Display Co., Ltd., Seoul (KR)

( * ) Notice: Subject to any disclaimer, the term of this patent is extended or adjusted under 35 U.S.C. 154(b) by 0 days.

(21) Appl. No.: 12/352,837

(22) Filed: Jan. 13, 2009

(65) Prior Publication Data

US 2009/0170228 A1 Jul. 2, 2009

Related U.S. Application Data

(62) Division of application No. 11/207,668, filed on Aug. 18, 2005, now Pat. No. 7,494,695.

(30) Foreign Application Priority Data

Dec. 17, 2004 (KR) .................. 10-2004-107723

(51) Int. Cl.
*H01L 21/00* (2006.01)
(52) U.S. Cl. .................. 438/149; 438/151; 438/158; 257/E21.414
(58) Field of Classification Search .................. 438/149, 438/151, 158, 30; 257/E21.414
See application file for complete search history.

(56) References Cited

U.S. PATENT DOCUMENTS

| | | | |
|---|---|---|---|
| 6,408,753 B1 | 6/2002 | Finn et al. | |
| 6,759,348 B1 * | 7/2004 | Cho et al. | 438/778 |
| 6,882,394 B2 * | 4/2005 | Doi et al. | 349/133 |
| 6,940,578 B2 | 9/2005 | Baek et al. | |
| 7,477,335 B2 * | 1/2009 | Cho et al. | 349/43 |
| 7,569,153 B2 * | 8/2009 | Baek et al. | 216/23 |
| 2004/0121696 A1 | 6/2004 | Kim | |

FOREIGN PATENT DOCUMENTS

| | | |
|---|---|---|
| CN | 1460893 A | 12/2003 |
| CN | 1508598 A | 6/2004 |
| JP | 05-011270 | 1/1993 |

(Continued)

OTHER PUBLICATIONS

Office Action issued in corresponding Chinese Patent Application No. 2005101320281; issued Nov. 24, 2008.

*Primary Examiner*—Michael Trinh
(74) *Attorney, Agent, or Firm*—Brinks Hofer Gilson & Lione

(57) ABSTRACT

A method of forming a pattern having a step difference and a method of making a thin film transistor and an LCD device using the method of forming the pattern. The method of forming a pattern having a step difference includes forming a first pattern having a predetermined shape in a first printing roll, rotating the first printing roll on a substrate to transfer the first pattern onto the substrate, forming a second pattern having a predetermined shape in a second printing roll, and rotating the second printing roll on the substrate onto which the first pattern is transferred, to transfer the second pattern onto the substrate.

6 Claims, 17 Drawing Sheets

FOREIGN PATENT DOCUMENTS

| | | |
|---|---|---|
| JP | H11-058921 | 3/1999 |
| JP | H11-091229 | 4/1999 |
| JP | H11-198337 | 7/1999 |
| JP | 2000-70820 A | 3/2000 |
| JP | 2000-289320 | 10/2000 |
| JP | 2001-056405 | 2/2001 |
| JP | 2006-000939 | 1/2006 |
| JP | 2006-023948 | 1/2006 |
| JP | 2006-166165 | 6/2006 |
| JP | 2007-140314 | 6/2007 |

\* cited by examiner

FIG. 4F
① 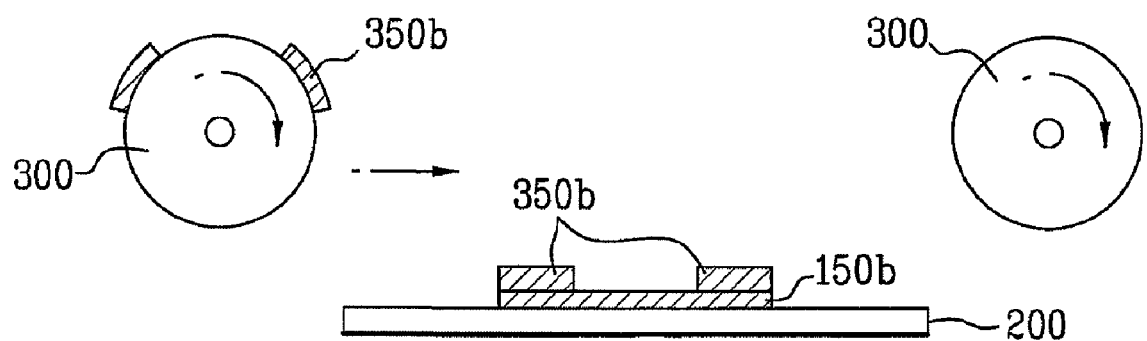
② 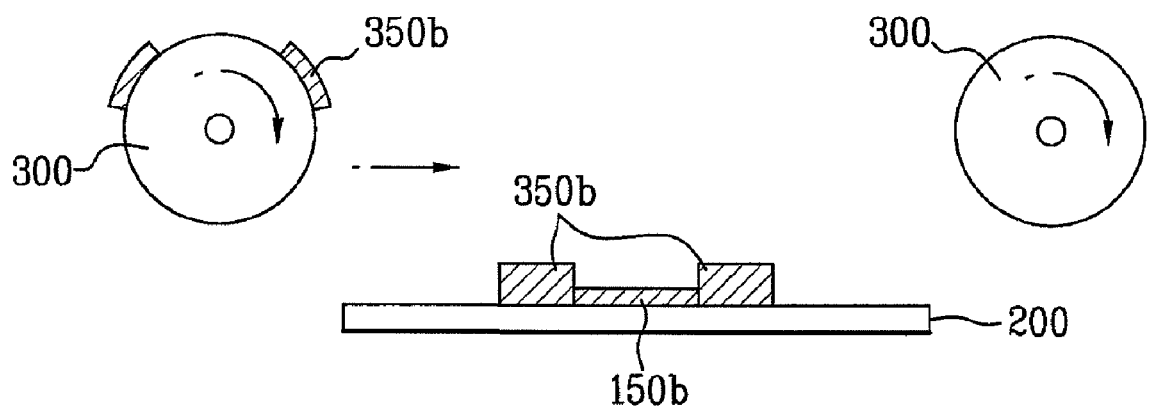

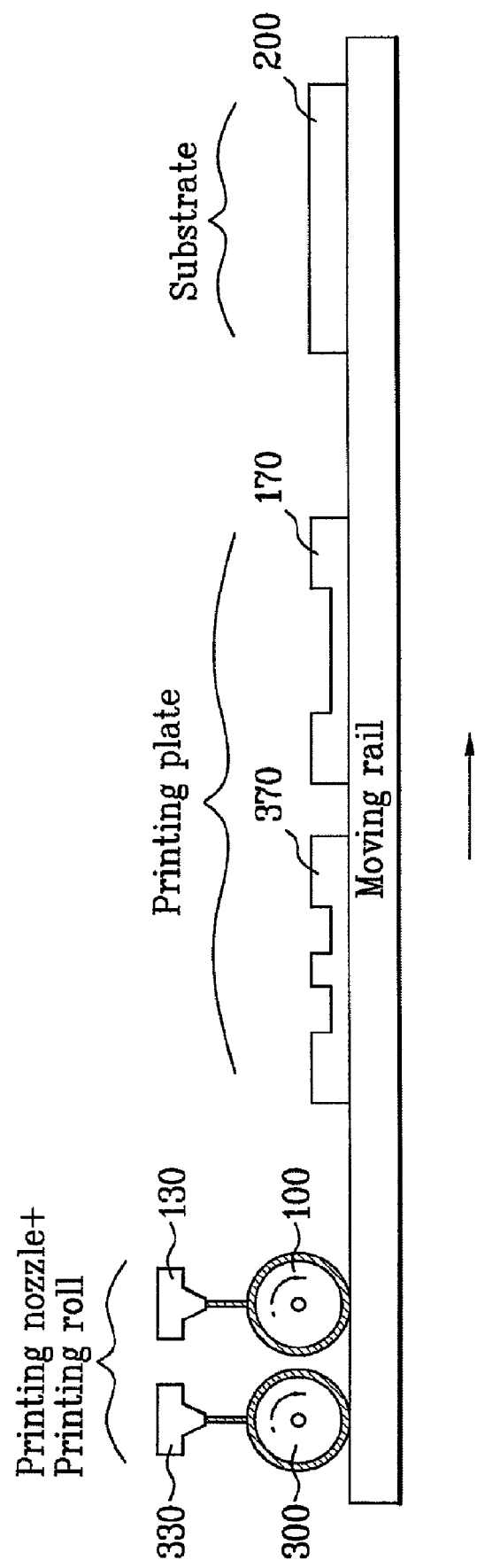

METHOD OF FORMING PATTERN HAVING STEP DIFFERENCE AND METHOD OF MAKING THIN FILM TRANSISTOR AND LIQUID CRYSTAL DISPLAY USING THE SAME

RELATED APPLICATIONS

The present patent document is a divisional of U.S. application Ser. No. 11/207,668, filed Aug. 18, 2005, U.S. Pat. No. 7,494,695, which claims the benefit of Korean Application No. P2004-107723, filed on Dec. 17, 2004, which is hereby incorporated by reference as if fully set forth herein.

TECHNICAL FIELD

The present invention relates to a liquid crystal display (LCD) device, and more particularly, to a method of forming a pattern of an LCD device.

BACKGROUND

An ultra thin flat panel display device has a display screen with a thickness of several centimeters. Especially, a liquid crystal display (LCD) device among the flat panel display device is widely used for monitors of notebook computers, spacecrafts, and aircrafts, owing to features and advantages of low driving voltage, low power consumption, and portable size.

The LCD device includes a lower substrate, an upper substrate, and a liquid crystal layer formed between the substrates. Generally, a thin film transistor and a pixel electrode are formed on the lower substrate, and a light-shielding layer, a color filter layer and a common electrode are formed on the upper substrate.

As mentioned above, the LCD device includes various elements, and a number of processes are repeatedly required to form the elements. Therefore, to improve productivity under the mass production system, various efforts are required in the process of forming the elements constituting the LCD device. Examples of efforts include reducing the process time, improving process devices to reduce the manufacturing cost, and developing a new process. Therefore, various improvements have been suggested.

As an example of such improvements, there is an improvement in the process of making a thin film transistor formed on a lower substrate of an LCD device. Hereinafter, the process of making a thin film transistor will be described in more detail with reference to the accompanying drawings.

FIG. 1 is a sectional view illustrating a thin film transistor formed on a lower substrate for a general LCD device.

As shown in FIG. 1, a gate electrode 12 is formed on a substrate 10, and a gate insulating film 14 is formed on a gate electrode. A semiconductor layer 16 is formed on the gate insulating film 14, and a source electrode 18a and a drain electrode 18b are formed separated from each other on the semiconductor layer 16.

To form such a thin film transistor in the related art, a mask for patterning the gate electrode 12, a mask for patterning the semiconductor layer 16, and a mask for patterning the source and drain electrodes 18a and 18b were required. In other words, in the related art, three masks were required to form the thin film transistor, and three pattern formation processes were required because the elements were separately patterned.

In this respect, studies for reducing the number of pattern formation processes have been performed. As a result, a method for patterning the semiconductor layer 16 and the source and drain electrodes 18a and 18b using one mask through diffraction exposure has been recently developed.

FIG. 2A to FIG. 2D are sectional views illustrating a process of forming a thin film transistor to reduce the number of masks and pattern formation processes.

As shown in FIG. 2A, a gate electrode 12 is formed on a substrate 10, and a gate insulating film 14, a semiconductor layer 16 and a metal layer 18 for source and drain electrodes are sequentially formed on the gate electrode 12.

Afterwards, as shown in FIG. 2B, a mask pattern 20 having a step difference is formed on the metal layer 18 using diffraction exposure. A method of forming the mask pattern 20 having a step difference using the diffraction exposure is shown in FIG. 3A to FIG. 3C.

First, as shown in FIG. 3A, a resist layer 20 to be a mask pattern is formed on the substrate 10. Then, as shown in FIG. 3B, a diffraction mask 30 is disposed on the substrate 10 where the resist layer 20 is formed, and then light is irradiated thereon. The diffraction mask 30 includes a light-transmitting region 30a, a light-shielding region 30b, and a partially light-transmitting region 30c. Thereafter, the mask pattern 20 having a step difference is completed by a developing process as shown in FIG. 3C. During the developing process, the resist layer corresponding to the light-transmitting region is removed, the resist layer corresponding to the light-shielding region remains, and the resist layer corresponding to the partially light-transmitting region is partially removed. Thus, the mask pattern 20 is formed with a step difference.

Afterwards, as shown in FIG. 2C, the semiconductor layer 16 and the metal layer 18 at left and right sides of the mask pattern are removed by an etching process.

Subsequently, as shown in FIG. 2D, the metal layer 18 at a middle portion of the mask pattern is removed to form the source and drain electrodes 18a and 18b. The mask pattern 20 is finally removed to complete the thin film transistor.

As described above, the semiconductor layer and the source and drain electrodes are formed by one process using the mask pattern 20 manufactured with a step difference by the diffraction exposure, thereby improving productivity.

The above method based on one mask has advantages in that the process steps were simplified and the process time was reduced in comparison with the related art method for forming a semiconductor layer and source and drain electrodes using two masks. However, in the method based on one mask, there exists a problem in that the process time is still long because exposure and developing processes are required. Moreover, a problem occurs in that the manufacturing cost increases because a diffraction mask of high cost is required.

BRIEF SUMMARY

Accordingly, the present invention is directed to a method of forming a pattern having a step difference and a method of making a thin film transistor and an LCD device, which substantially obviate one or more problems due to limitations and disadvantages of the related art.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the invention, as embodied and broadly described herein, a method of forming a pattern having a step difference includes the steps of a) forming a first pattern having a predetermined shape on a first printing roll, b) rotating the first printing roll on a substrate to transfer the first pattern onto the substrate, c) forming a second pattern having a predetermined shape on a second printing roll, and d) rotating the second printing roll on the substrate, to transfer the second pattern onto the substrate.

In the present invention, since the pattern having a step difference is formed using the printing rolls, exposure and developing processes are not required unlike the related art diffraction exposure. Therefore, the manufacturing cost is reduced and the manufacturing processes are reduced.

In another aspect of the present invention, a method of making a thin film transistor includes the steps of preparing a mask having a step difference using the method of forming a pattern and forming a semiconductor layer, a source electrode and a drain electrode using the mask having a step difference.

In other aspect of the present invention, a method of making an LCD device is provided using the method of making a thin film transistor through the mask having a step difference.

In yet another aspect, a method of forming a pattern having a step difference includes forming a first pattern having a predetermined shape on a first printing roll and forming a second pattern having a predetermined shape on a second printing roll and sequentially rotating the first printing roll on a substrate to transfer the first pattern onto the substrate and rotating the second printing roll on the substrate, to transfer the second pattern onto the substrate.

In still another aspect, a method of making a thin film transistor includes forming a gate electrode on a substrate; forming a gate insulating film on the substrate including the gate electrode; sequentially forming a semiconductor layer and a metal layer on the gate insulating film; sequentially rotating a first printing roll on a the metal layer to transfer a first pattern onto the metal layer and rotating a second printing roll on the first pattern to transfer a second pattern onto the onto the first pattern to form a masking pattern having a step difference on the metal layer; etching the semiconductor layer and the metal layer using the masking pattern as a etch mask; and removing the pattern.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 4A to FIG. 4F are sectional views illustrating a method of forming a pattern having a step difference according to the first embodiment of the present invention;

FIG. 6 is a layout of a method of forming a pattern having a step difference according to the first embodiment of the present invention;

DETAILED DESCRIPTION OF THE DRAWINGS AND THE PRESENTLY PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

In the first to third embodiments, although one pattern is formed on a substrate, a plurality of patterns may be formed thereon.

First Embodiment

FIG. 4A to FIG. 4F are sectional views illustrating a method of forming a pattern having a step difference according to the first embodiment of the present invention.

Figure 1:
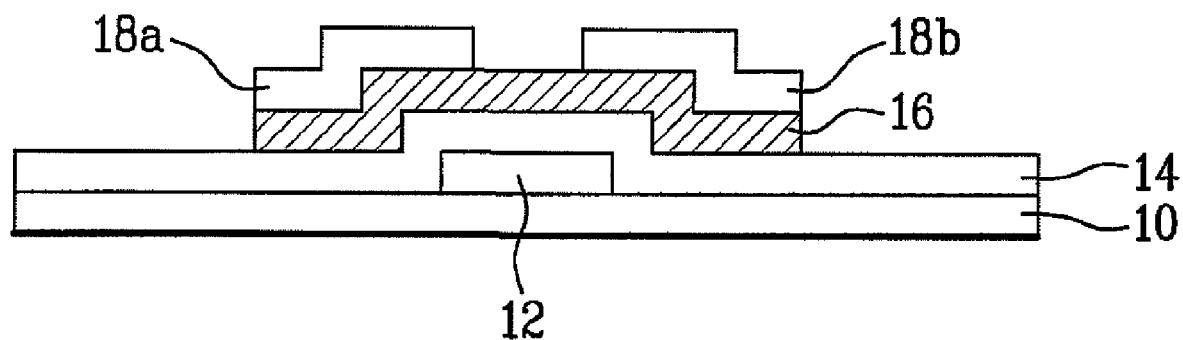
FIG. 1 is a sectional view illustrating a thin film transistor formed on a lower substrate of a related art LCD device.
Figure 2A:
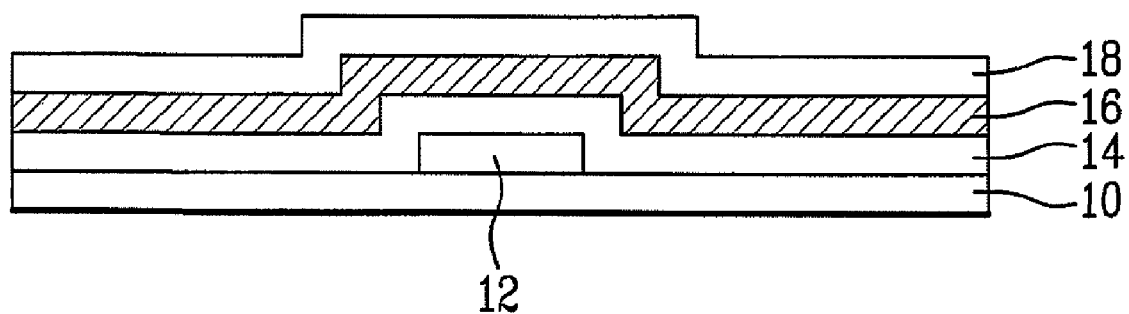
FIG. 2A to FIG. 2D are sectional views illustrating a related art process of forming a thin film transistor.
Figure 2B:
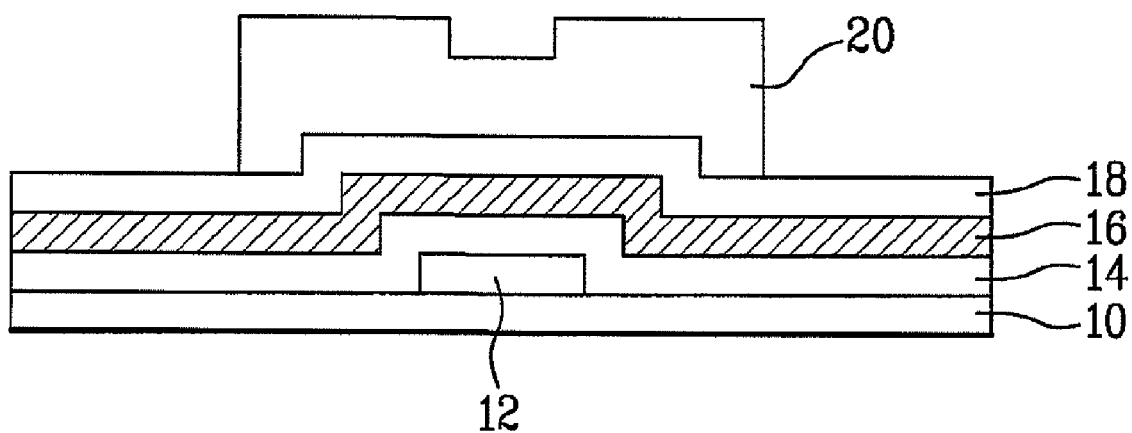
Figure 2C:
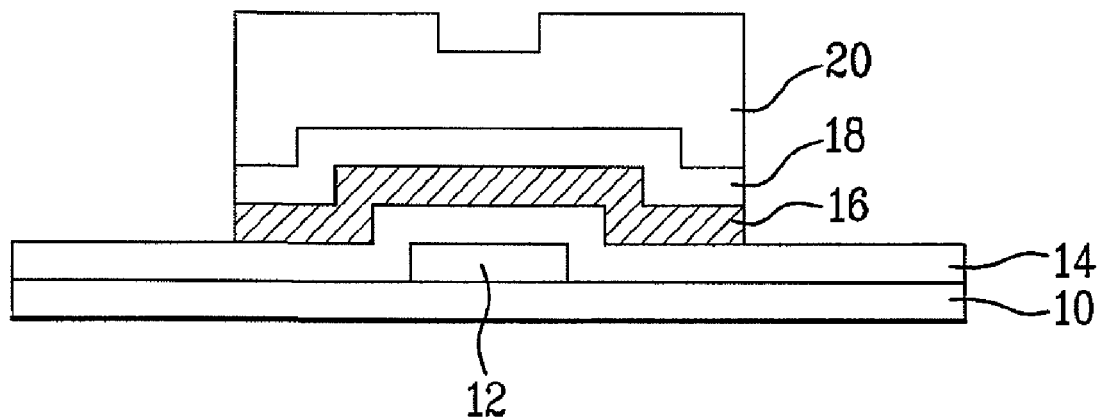
Figure 2D:
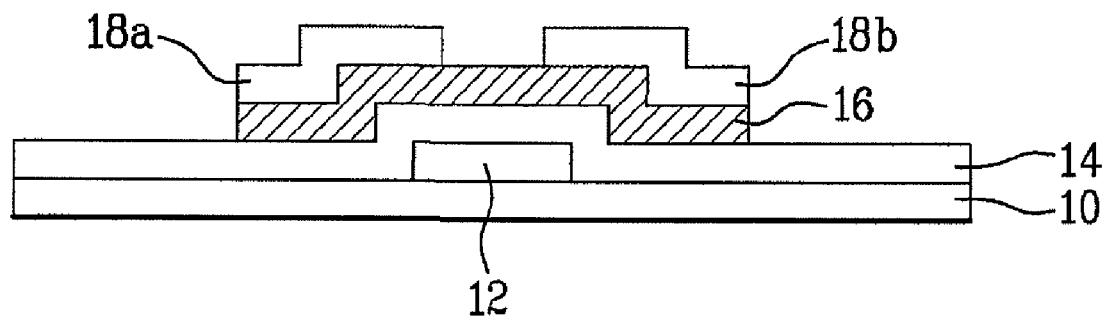
Figure 3A:
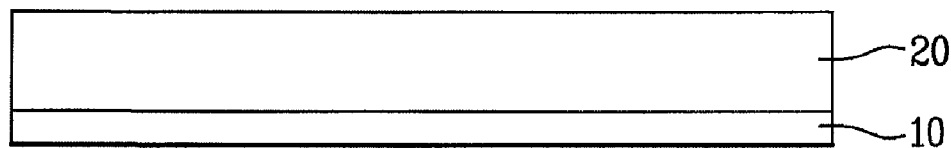
FIG. 3A to FIG. 3C illustrate a method of forming a mask pattern having a step difference using a related art diffraction exposure.
Figure 3B:
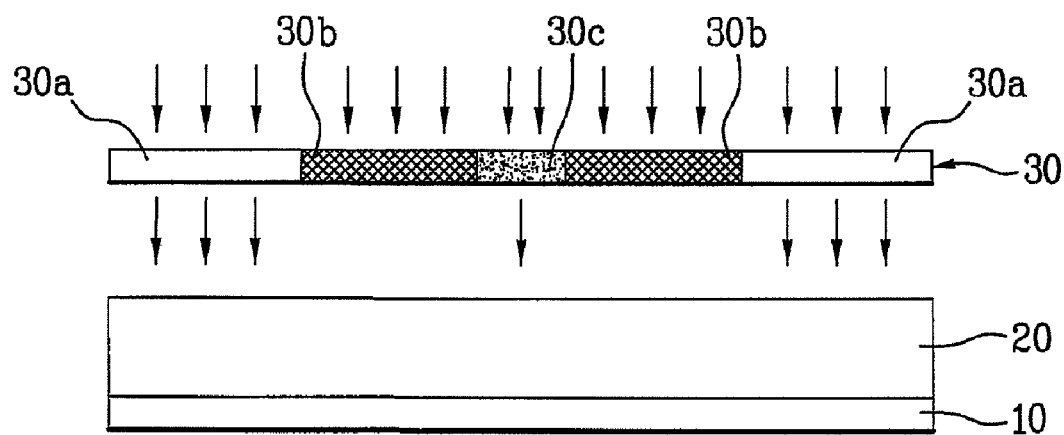
Figure 3C:
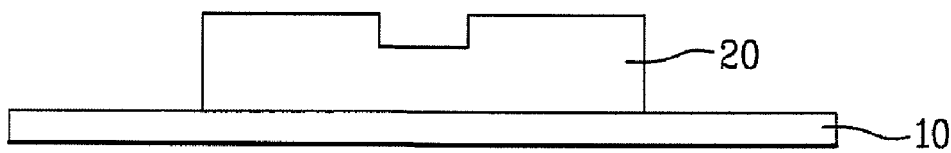
Figure 4A:
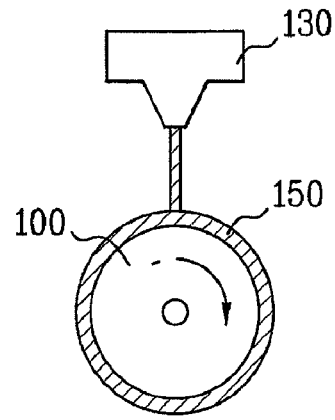

As shown in FIG. 4A, a pattern material 150 is coated on a first printing roll 100 using a first printing device 130.

Figure 4B:
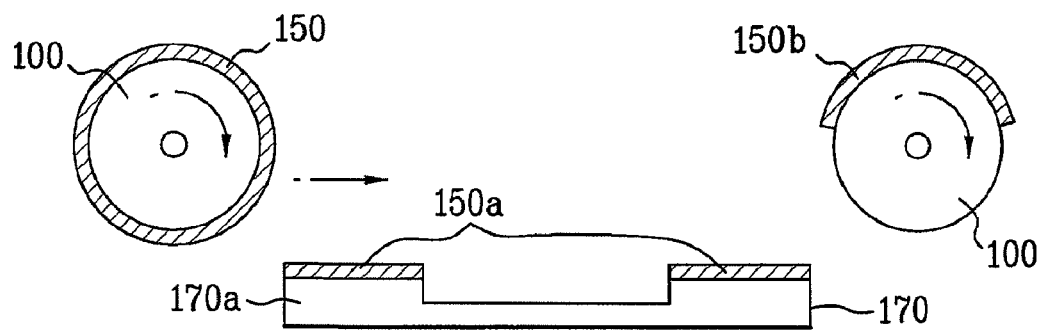

Afterwards, as shown in FIG. 4B, the first printing roll 100 is rotated on a first printing plate 170 provided with a projection 170a having a predetermined shape. In such case, a pattern material 150a is partially transferred onto the projection 170a of the first printing plate 170 to form a first pattern 150b having a predetermined shape on the first printing roll 100.

Figure 4C:
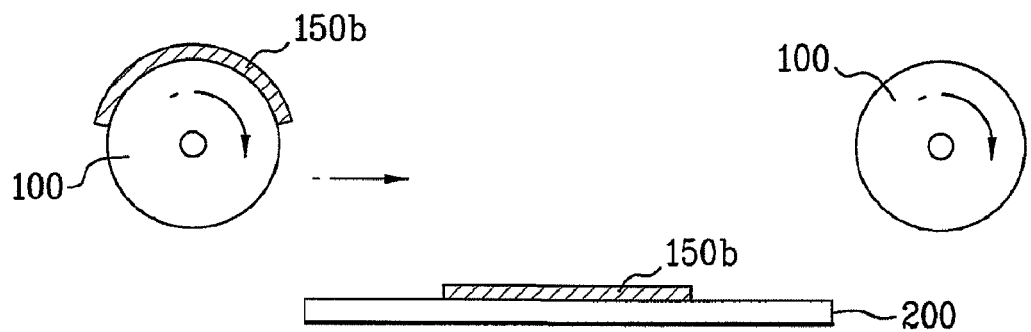

Subsequently, as shown in FIG. 4C, the first printing roll 100 is rotated on a substrate 200 so that the first pattern 150b is formed on the substrate 200.

Figure 4D:
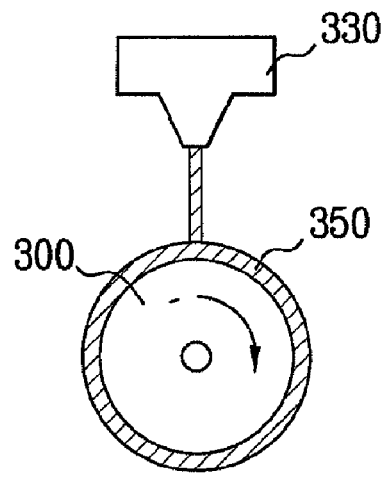

As shown in FIG. 4D, a pattern material 350 is coated on a second printing roll 300 using a second printing device 330.

Figure 4E:
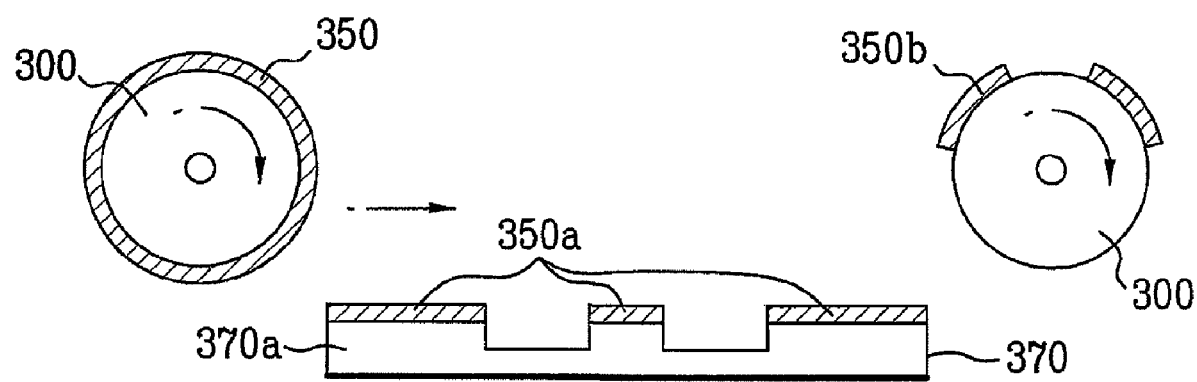

As shown in FIG. 4E, the second printing roll 300 is rotated on a second printing plate 370 where a projection 370a having a predetermined shape is formed. In such case, a pattern material 350a is partially transferred onto the projection 370a of the second printing plate 370 to form a second pattern 350b having a predetermined shape on the second printing roll 300.

Thereafter, as shown in FIG. 4F, the second printing roll 300 is rotated on the substrate 200 where the first pattern 150b is formed, so that the second pattern 350b is formed on the substrate 200.

As described above, the pattern having a step difference is formed as the first pattern 150b and the second pattern 350b are formed in combination. A pattern having various shapes can be formed if the first pattern 150b and the second pattern 350b are formed in proper combination.

Meanwhile, to form a pattern having a U-shape in cross-section, the second pattern 350b may be formed on the first pattern 150b as shown in step (1) of FIG. 4F while the second pattern 350b may be formed at a side of the first pattern 150b as shown in step (2) of FIG. 4F.

In step (2) of FIG. 4F, the height of the second pattern 350b should be higher than that of the first pattern 150b. In step (1) of FIG. 4F, it is noted that the second pattern 350b and the first pattern 150b may not have the same height as each other and their heights may be modified properly if necessary. The height difference between the first pattern 150b and the second pattern 350b can be obtained by controlling either the amount of the pattern materials 150 and 350 discharged from the first printing device 130 and the second printing device 330 or rotational speed of the first printing roll 100 and the second printing roll 300.

If the height difference between the first pattern 150b and the second pattern 350b is obtained by controlling the amount of the pattern materials 150 and 350 discharged from the printing nozzles, a printing nozzle shown in FIG. 5 is preferably used.

Figure 5A:
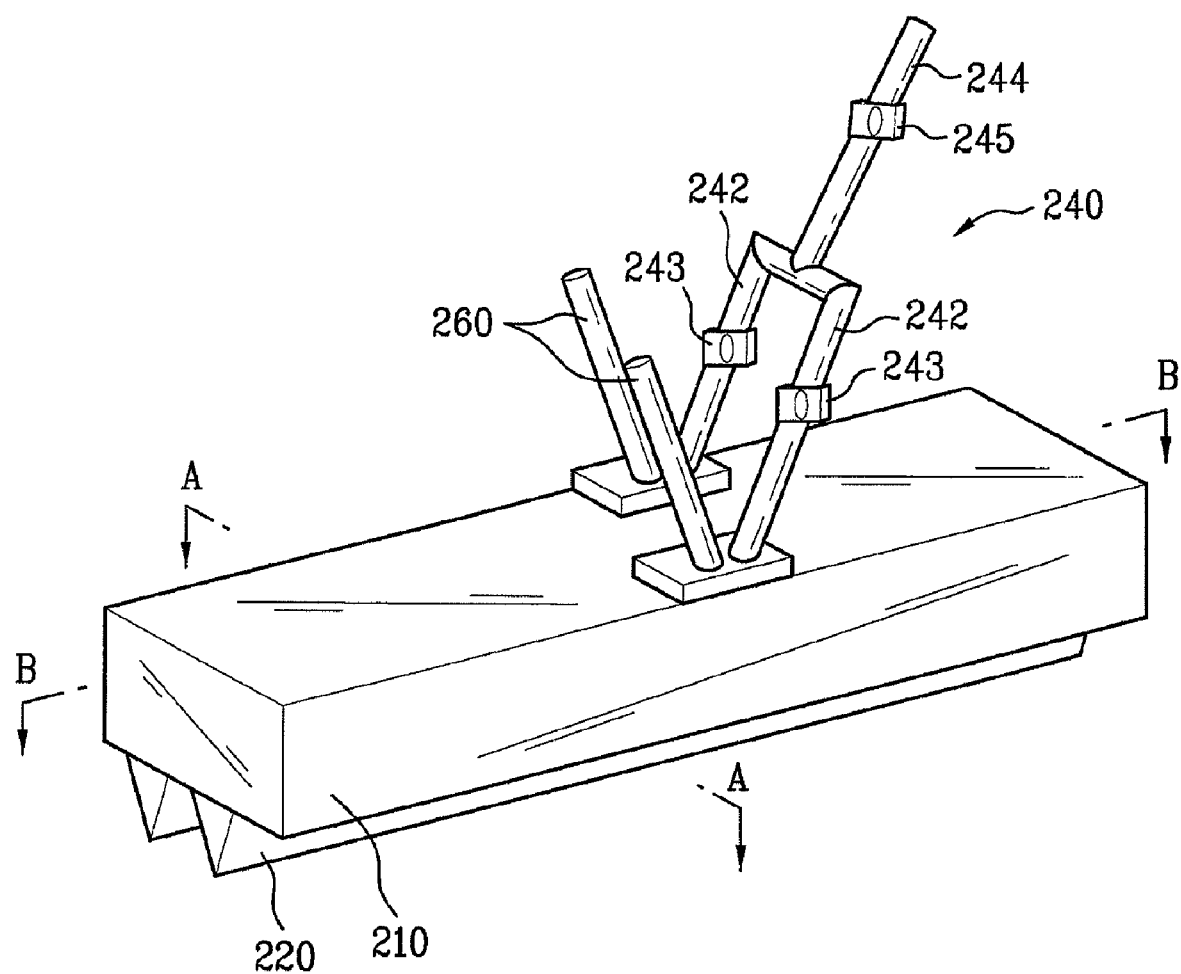
FIG. 5A is a perspective view illustrating a printing nozzle according to the present invention.
Figure 5B:
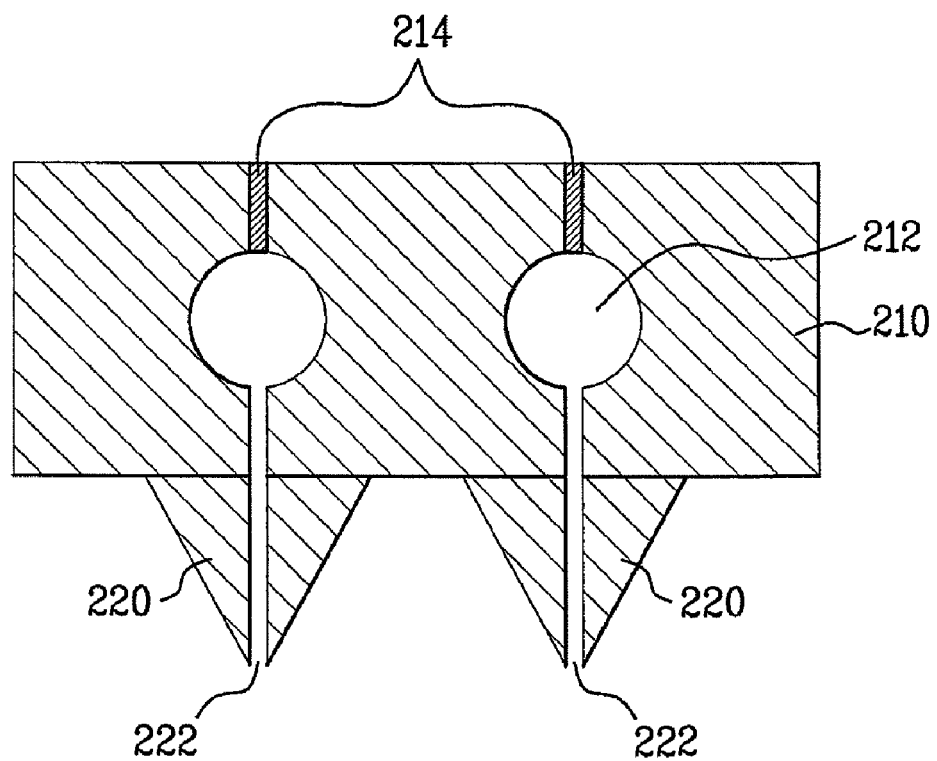
FIG. 5B is a sectional view taken along line A-A of FIG. 5A.
Figure 5C:
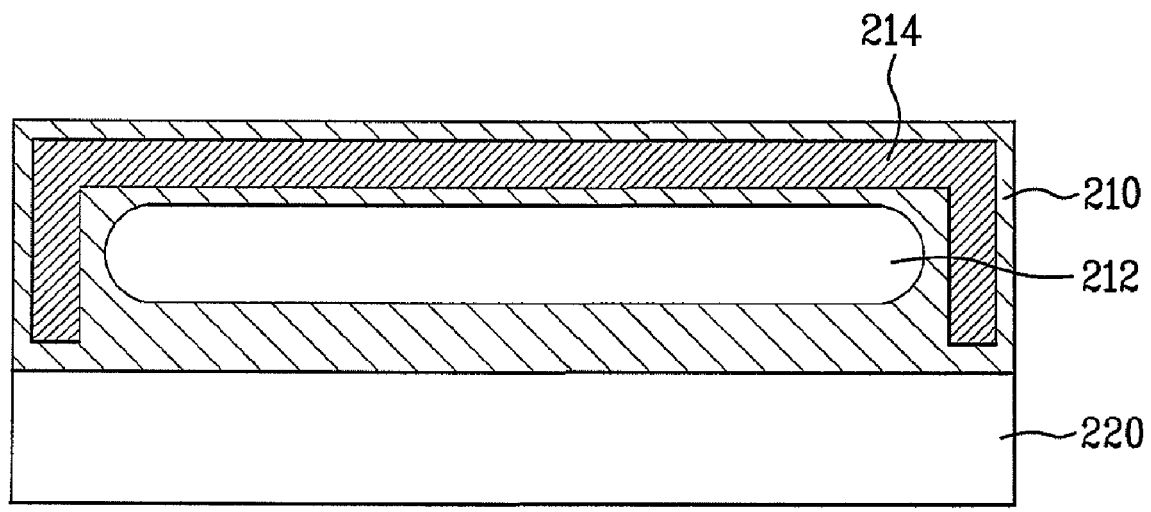
FIG. 5C is a sectional view taken along line B-B of FIG. 5A.

FIG. 5A is a perspective view illustrating a printing device according to the present invention, FIG. 5B is a sectional view taken along line A-A of FIG. 5A, and FIG. 5C is a sectional view taken along line B-B of FIG. 5A. Since the printing device of FIG. 5 includes a plurality of nozzle portions that can separately control the amount of the pattern materials, it is possible to easily control the amount of the pattern materials coated on the printing roll, thereby easily controlling the thickness of the pattern. Hereinafter, the printing nozzle according to the present invention will be described in more detail with reference to FIG. 5A to FIG. 5C.

As shown in FIG. 5A, the printing device of the present invention includes a main body 210, a plurality of nozzle units 220 formed below the main body 210, a supply tube 240 for supplying the pattern materials to the main body 210, and an exhaust tube 260 draining the pattern materials from the main body 210. Although two nozzle units 220 are formed in the drawing, they are not limited to such case.

Referring to FIG. 5B and FIG. 5C, a plurality of grooves 212 are formed inside the main body 210 to receive the pattern materials therein.

The nozzle units 220 are provided with slits 222 connected with the grooves 212, so that the slits 222 can discharge the pattern materials to be coated on the printing roll.

Further, a spacer 214 is formed inside the main body 210, and the size of each slit 222 is controlled by controlling the width of the spacer 214.

Referring to FIG. 5A, the supply tube 240 connected with the main body 210 includes a plurality of sub supply tubes 242 and a main supply tube 244. The sub supply tubes 242 are respectively connected with the grooves 212 to supply the pattern materials to the grooves 212. The main supply tube 244 connects the sub supply tubes 242 with each other.

Furthermore, the main supply tube 244 is provided with a main valve 245 to control a flow rate of the pattern materials supplied to the sub supply tubes 242. The sub supply tubes 242 are provided with a sub valve 243 to control the flow rate of the pattern materials supplied to the grooves 212.

As described above, after the pattern materials are received in the grooves 212 through the sub supply tubes 242, they are coated on the printing roll through the slits 222. At this time, the amount of the pattern materials discharged to the slits 222 is wholly controlled through the main valve 245. In addition, the amount of the pattern materials discharged to the slits 222 is separately controlled through the sub valve 243. Therefore, the discharge amount of the pattern materials can freely be controlled. This could easily control the pattern materials coated on the printing roll.

Meanwhile, the processes of FIG. 4A to FIG. 4F are performed more preferably in such a manner that a first pattern formation process (shown in FIG. 4A to FIG. 4C) and a second pattern formation process (shown in FIG. 4D to FIG. 4F) alternate for the unit of a predetermined time, than in such a manner that the processes of FIG. 4A to FIG. 4F are performed in serial order.

In other words, as shown in FIG. 6, the printing devices, the printing rolls, the printing plates, and the substrate are sequentially disposed on a moving rail. The first printing device 130 and the first printing roll 100 for the first pattern are disposed at the front while the second printing device 330 and the second printing roll 300 for the second pattern are disposed at the rear. The first printing plate 170 is disposed at the front while the second printing plate 370 is disposed at the rear. By doing so, the first pattern formation process and the second pattern formation process can be performed alternately for the unit of a predetermined time.

Second Embodiment

FIG. 7A to FIG. 7F are sectional views illustrating a method of forming a pattern having a step difference according to the second embodiment of the present invention.

Figure 7A:
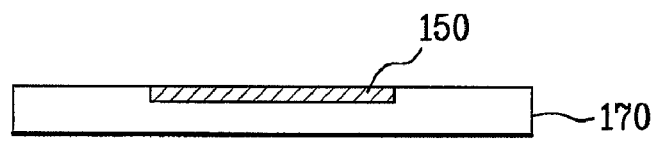
FIG. 7A to FIG. 7F are sectional views illustrating a method of forming a pattern having a step difference according to the second embodiment of the present invention.

First, as shown in FIG. 7A, the first printing plate 170 provided with a recess having a predetermined shape is prepared, and the pattern material 150 is formed in the recess.

Figure 7B:
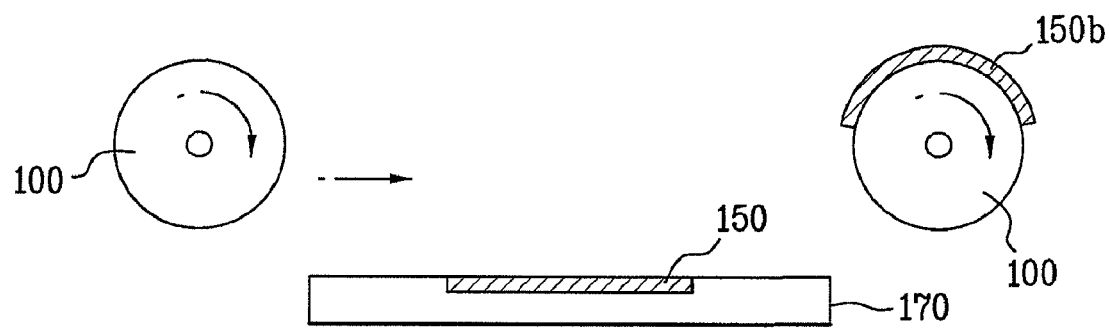

Afterwards, as shown in FIG. 7B, the first printing roll 100 is rotated on the first printing plate 170 so that the pattern material 150 formed in the recess of the first printing plate 170 is transferred onto the first printing roll 100 to form the first pattern 150b having a predetermined shape on the first printing roll 100.

Figure 7C:
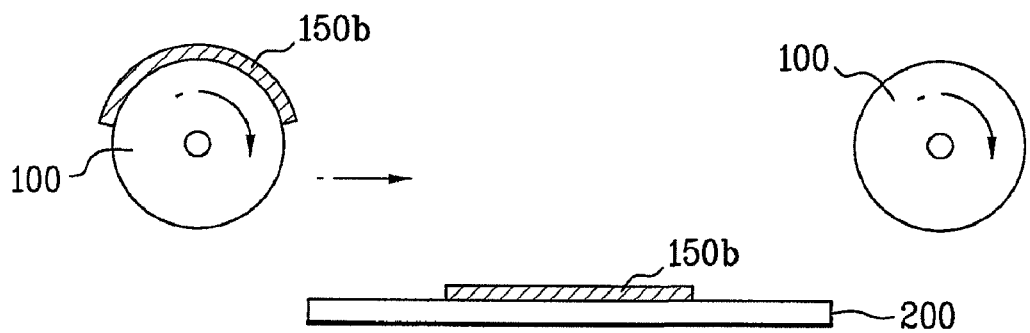

Subsequently, as shown in FIG. 7C, the first printing roll 100 is rotated on the substrate 200 so that the first pattern 150b is formed on the substrate 200.

Figure 7D:
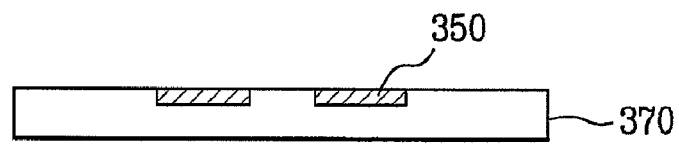

As shown in FIG. 7D, the second printing plate 370 provided with a recess having a predetermined shape is prepared, and the pattern material 350 is formed in the recess.

Figure 7E:
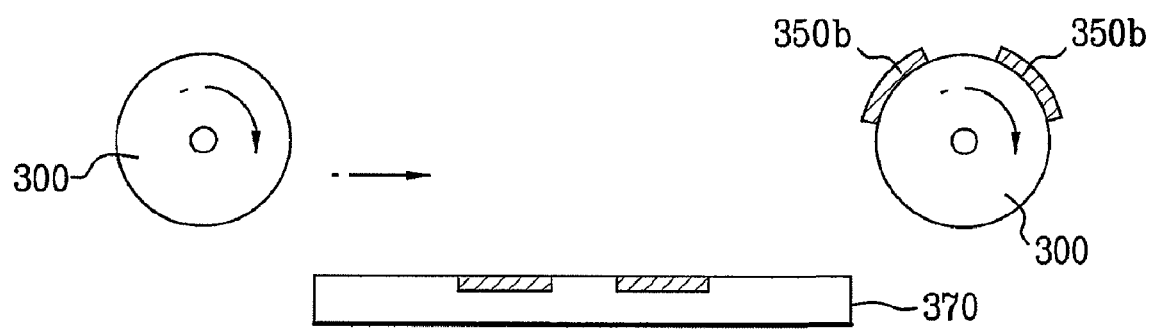

Then, as shown in FIG. 7E, the second printing roll 300 is rotated on the second printing plate 370 so that the pattern material 350 formed in the recess is transferred onto the second printing roll 300 to form the second pattern 350b having a predetermined shape on the second printing roll 300.

Figure 7F:
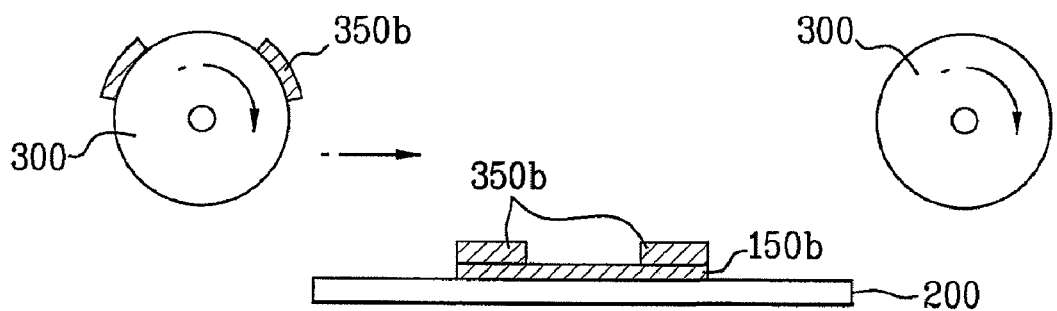

Thereafter, as shown in FIG. 7F, the second printing roll 300 is rotated on the substrate 200 where the first pattern 150b is formed, so that the second pattern 350b is formed on the substrate 200.

As described above, the pattern having a step difference is formed as the first pattern and the second pattern are formed in combination.

Although the second pattern 350b is formed on the first pattern 150b in FIG. 7F to form a pattern having a U-shape in cross section, the second pattern 350b may be formed at a side of the first pattern 150b to form a pattern having U-shape in cross-section in the same manner as the first embodiment.

Further, the printing nozzle shown in FIG. 5 is preferably used to control the height difference between the first pattern 150b and the second pattern 350b in the same manner as the first embodiment.

Still further, in the same manner as the first embodiment, the processes of FIG. 7A to FIG. 7F are performed more preferably in such a manner that a first pattern formation process (shown in FIG. 7A to FIG. 7C) and a second pattern formation process (shown in FIG. 7D to FIG. 7F) alternate for the unit of a predetermined time, than in such a manner that the processes of FIG. 7A to FIG. 7F are performed in serial order.

Third Embodiment

FIG. 8A to FIG. 8D are sectional views illustrating a method of forming a pattern having a step difference according to the third embodiment of the present invention.

Figure 8A:
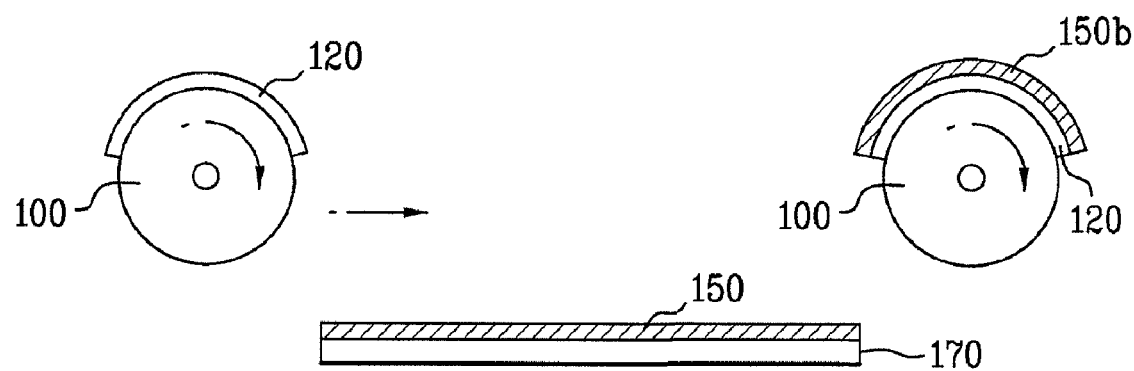
FIG. 8A to FIG. 8D are sectional views illustrating a method of forming a pattern having a step difference according to the third embodiment of the present invention.

First, as shown in FIG. 8A, the first printing roll 100 provided with a convex structure 120 having a predetermined shape is prepared, and the first printing roll 100 is rotated on the first printing plate 170 coated with the pattern material 150 so that the pattern material is transferred onto the convex structure 120 to form the first pattern 150b having a predetermined shape on the first printing roll 100.

Figure 8B:
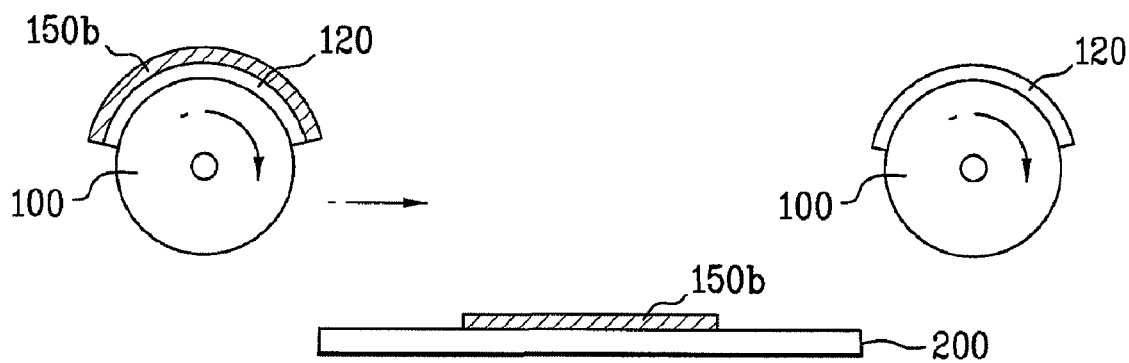

Afterwards, as shown in FIG. 8B, the first printing roll 100 is rotated on the substrate 200 so that the first pattern 150b is formed on the substrate 200.

Figure 8C:
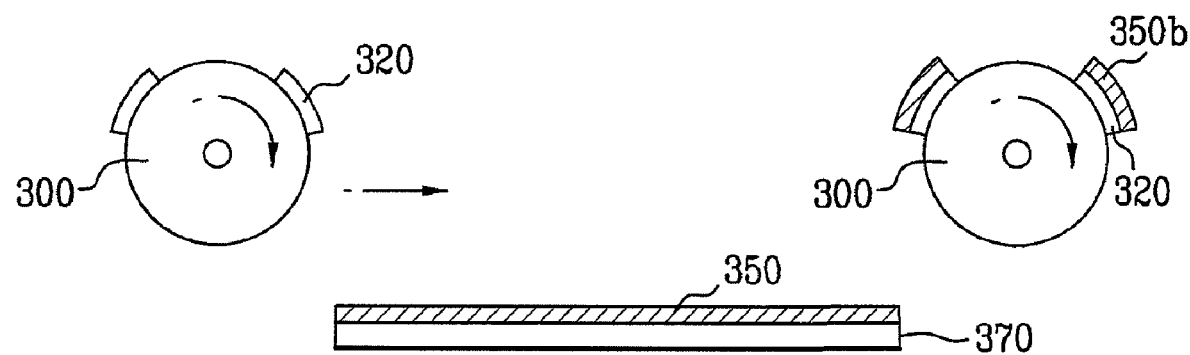

Subsequently, as shown in FIG. 8C, the second printing roll 300 provided with a convex 320 having a predetermined shape is prepared, and the second printing roll 300 is rotated on the second printing plate 370 so that the pattern material is transferred onto the convex 320 to form the second pattern 350b having a predetermined shape on the second printing roll 300.

Figure 8D:
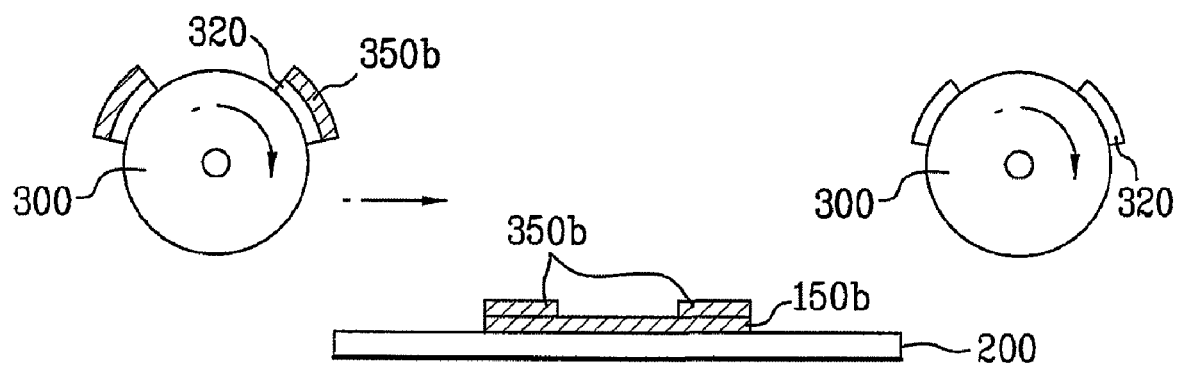

Thereafter, as shown in FIG. 8D, the second printing roll 300 is rotated on the substrate 200 where the first pattern 150b is formed, so that the second pattern 350b is formed on the substrate 200.

As described above, the pattern having a step difference is formed as the first pattern and the second pattern in combination are formed.

Although the second pattern 350b is formed on the first pattern 150b in FIG. 8D to form a pattern having a U-shape in cross-section, the second pattern 350b may be formed at a side of the first pattern 150b to form a pattern having a U-shape in cross-section in the same manner as the first embodiment.

Further, the printing nozzle shown in FIG. 5 is preferably used to control the height difference between the first pattern 150b and the second pattern 350b in the same manner as the first embodiment.

Still further, in the same manner as the first embodiment, the processes of FIG. 8A to FIG. 8D are performed more preferably in such a manner that a first pattern formation process (shown in FIG. 8A and FIG. 8B) and a second pattern formation process (shown in FIG. 8C and FIG. 8D) alternate for the unit of a predetermined time, than in such a manner that the processes of FIG. 8A to FIG. 8D are performed in serial order.

Although the method of forming a pattern having a step difference has been described referring to the three embodiments, it is not limited to the three embodiments.

Further, although the first pattern formation process and the second pattern formation process have been performed in accordance with the same embodiment, the first pattern formation process may be performed in accordance with the first embodiment while the second pattern formation process may be performed in accordance with the second embodiment or the third embodiment. In other words, it does not matter whether the first pattern formation process and the second pattern formation process are performed in accordance with any one of the first embodiment to the third embodiment.

2. Method of Making a Thin Film Transistor

FIG. 9A to FIG. 9D are sectional views illustrating a method of making a thin film transistor according to the embodiment of the present invention.

Figure 9A:
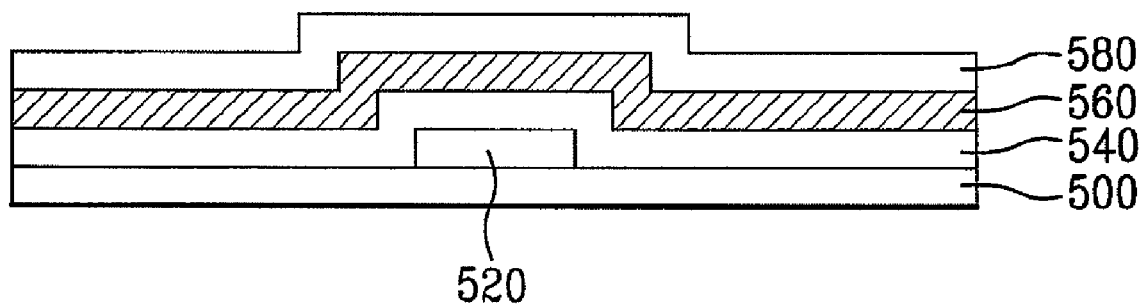
FIG. 9A to FIG. 9D are sectional views illustrating a method of making a thin film transistor according to the embodiment of the present invention.

First, as shown in FIG. 9A, a gate electrode 520 is formed on a substrate 500, and a gate insulating film 540 is formed on the entire surface of the substrate 500 including the gate electrode 520. A semiconductor layer 560 and a metal layer 580 for source and drain electrodes are sequentially formed on the gate insulating film 540.

Figure 9B:
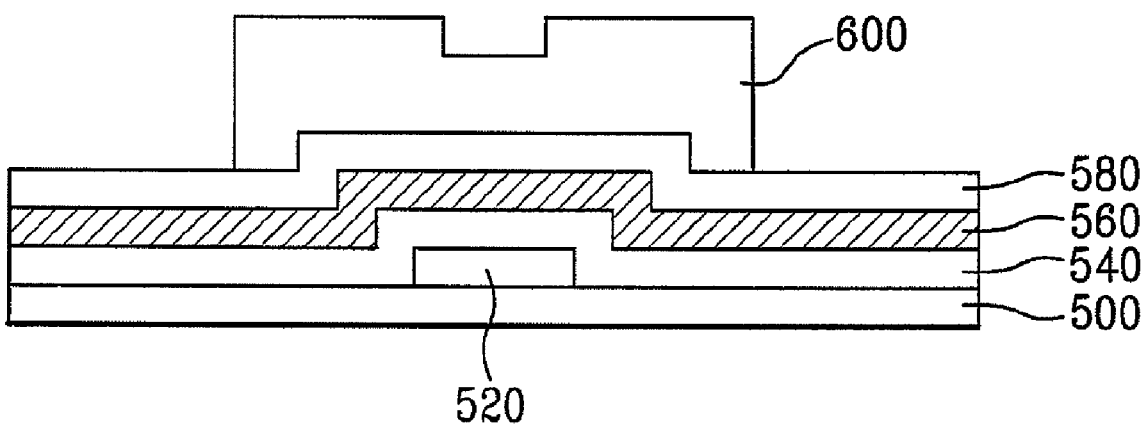

Afterwards, as shown in FIG. 9B, a pattern 600 having a step difference is formed on the metal layer 580.

The pattern 600 having a step difference is formed in accordance with the aforementioned embodiments.

Figure 9C:
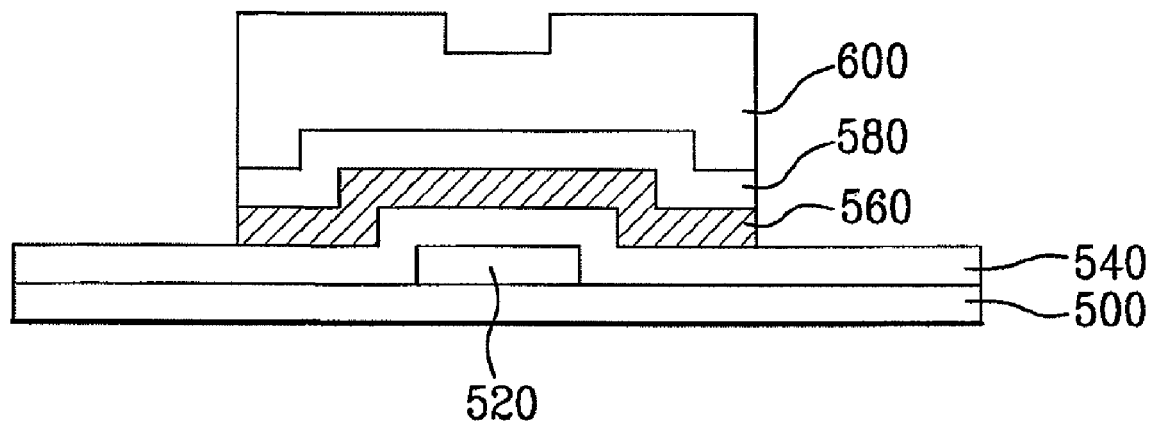
Figure 9D:
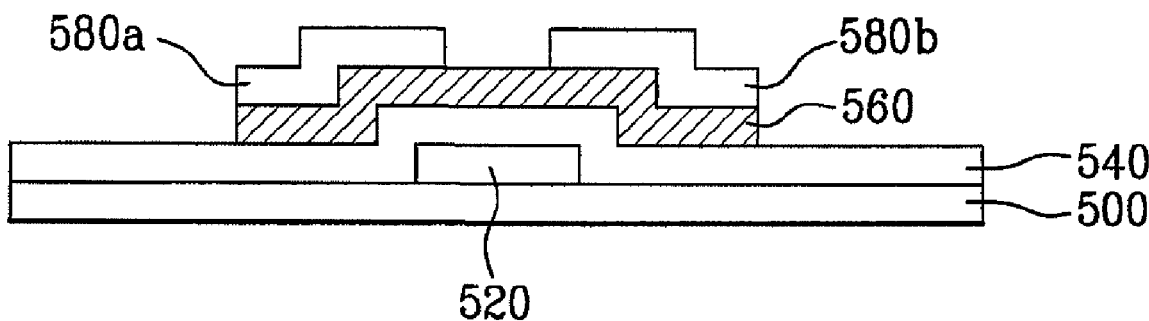

Then, as shown in FIG. 9C and FIG. 9D, the semiconductor layer 560 and the metal layer 580 are etched using the pattern 600 as a mask so that the semiconductor layer 560 and the source and drain electrodes 580a and 580b are completed.

In more detail, as shown in FIG. 9C, an etching process is performed using the pattern 600 as a mask to remove the semiconductor layer 560 and the metal layer 580 at left and right sides of the mask pattern. Afterwards, as shown in FIG. 9D, the metal layer 580 at a middle portion of the mask pattern 600 is removed to form the source and drain electrodes 580a and 580b. The mask pattern 600 is finally removed so that the thin film transistor is completed.

It will be apparent to those skilled in the art that various modifications can be made in the material of the elements constituting the thin film transistor, such as the gate electrode and the gate insulating film, and the method of forming the elements without departing from the spirit or scope of the inventions.

3. Method of Making an LCD Device

Figure 10A:
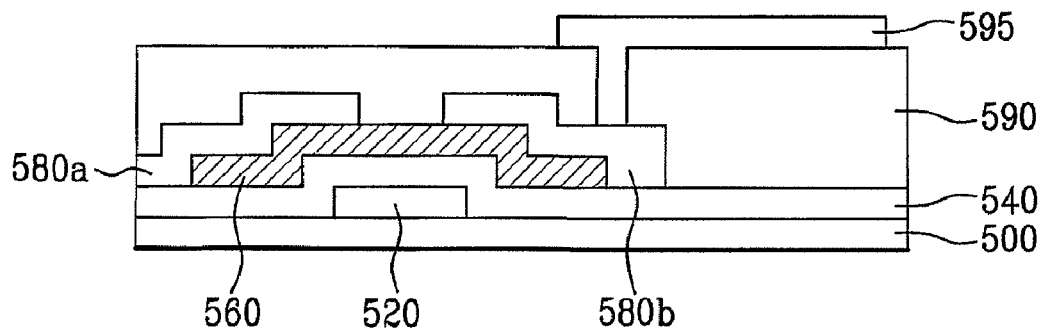
FIG. 10A to FIG. 10C are sectional views illustrating a method of making an LCD device according to the embodiment of the present invention.
Figure 10B:
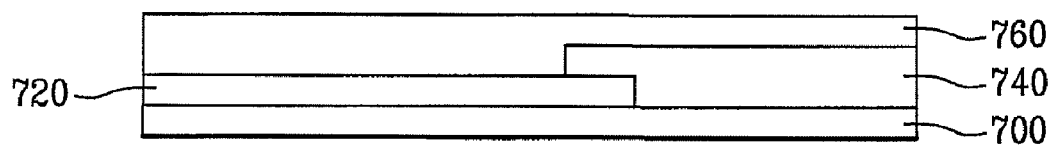
Figure 10C:
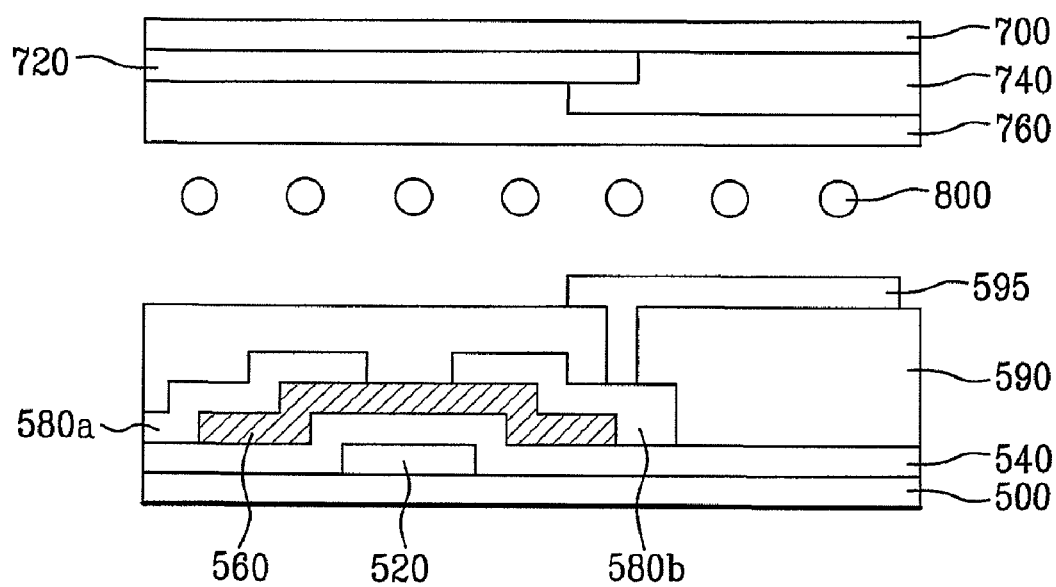

FIG. 10A to FIG. 10C are sectional views illustrating a method of making an LCD device according to the embodiment of the present invention.

As shown in FIG. 10A, the thin film transistor is formed on the first substrate 500, the thin film transistor being comprised of the gate electrode 520, the gate insulating film 540, the semiconductor substrate 560, the source electrode 580a and the drain electrode 580b. A passivation layer 590 is formed on the thin film transistor, and a pixel electrode 595 connected with the drain electrode 580b is formed on the passivation layer 590.

At this time, the thin film transistor is formed in accordance with the method of FIG. 9A to FIG. 9D.

Afterwards, as shown in FIG. 10B, a light-shielding layer 720, a color filter layer 740 and a common electrode 760 are sequentially formed on the second substrate 700.

Then, as shown in FIG. 10C, a liquid crystal layer 800 is formed between the substrates 500 and 700.

In this case, the liquid crystal layer 800 can be formed by a vacuum injection method or a liquid crystal dropping method. In the vacuum injection method, the first substrate 500 and the second substrate 700 are bonded together through a sealant provided with an injection hole and then a liquid crystal layer is formed using a capillary phenomenon at the injection hole and pressure difference between bonded substrates. In the liquid crystal dropping method, a liquid crystal is dropped onto either the first substrate 500 or the second substrate 700 to form a liquid crystal layer and then both substrates are bonded together.

If the size of the substrates becomes great, the time required to form the liquid crystal layer 800 using the vacuum injection method becomes long, thereby reducing productivity. In this case, it is preferable that the liquid crystal dropping method is used.

Meanwhile, in an in-plane switching (IPS) mode LCD device, the common electrode 760 is formed on the first substrate 500 not the second substrate 700 in parallel with the pixel electrode 595 so that alignment of the liquid crystal layer 800 is controlled by a voltage applied in parallel between the common electrode 760 and the pixel electrode 595.

It will be apparent to those skilled in the art that various modifications can be made in the material of the elements constituting the LCD device, and the method of forming the elements without departing from the spirit or scope of the inventions.

As aforementioned, the method of forming the pattern and the method of making the thin film transistor and the LCD device according to the present invention have the following advantages.

First, since the pattern having a step difference is formed using the printing rolls, exposure and developing processes are not required unlike the related art diffraction exposure. Therefore, the manufacturing cost is reduced and the manufacturing processes are reduced.

Second, since the first pattern formation process and the second pattern formation process alternate for the unit of a predetermined time, the manufacturing processes are reduced.

Finally, since the printing roll provided with a plurality of nozzle portions is used, it is possible to easily control the height of the pattern.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A method of making a thin film transistor comprising the steps of:
    forming a gate electrode on a substrate;
    forming a gate insulating film on the substrate including the gate electrode;
    sequentially forming a semiconductor layer and a metal layer on the gate insulating film;
    forming a pattern having a step difference on the metal layer having a U-shape in cross-section by comprising the steps of
        a) forming a first pattern having a predetermined shape on a first printing roll using a first printing plate;
        b) rotating the first printing roll on the metal layer to transfer the first pattern onto the metal layer;
        c) forming a second pattern having different shape from the first pattern on a second printing roll using a second printing plate, wherein the second printing roll being different from the first printing roll and the second printing plate is different from the first printing plate; and
        d) rotating the second printing roll on the metal layer to transfer the second pattern onto the first pattern;
    etching the semiconductor layer and the metal layer using the pattern as a mask; and
    removing the pattern.

2. A method of making an LCD device comprising the steps of:
    preparing a first substrate where a thin film transistor is formed by
        forming a gate electrode on a substrate;
        forming a gate insulating film on the substrate including the gate electrode;
        sequentially forming a semiconductor layer and a metal layer on the gate insulating film;
        forming a pattern having a step difference on the metal layer having a U-shape in cross-section by comprising the steps of
            a) forming a first pattern having a predetermined shape on a first printing roll using a first printing plate;
            b) forming a second pattern having different shape from the first pattern on a second printing roll using a second printing plate, wherein the second printing roll being different from the first printing roll and the second printing plate is different from the first printing plate; and
            c) sequentially rotating the first printing roll on the metal layer to transfer the first pattern onto the metal layer and rotating the second printing roll onto the metal layer to transfer the second pattern on the first pattern;
        etching the semiconductor layer and the metal layer using the pattern as a mask;
        removing the pattern;
    preparing a second substrate formed on a color filter layer; and
    forming a liquid crystal layer between the substrates.

3. The method according to claim 2, wherein the step of forming a liquid crystal layer comprises bonding the first and second substrates together after dropping a liquid crystal onto either the first substrate or the second substrate.

4. A method of making a thin film transistor comprising the steps of:
    forming a gate electrode on a substrate;
    forming a gate insulating film on the substrate including the gate electrode;
    sequentially forming a semiconductor layer and a metal layer on the gate insulating film;
    forming a first pattern having a predetermined shape on a first printing roll using a first printing plate;
    forming a second pattern having different shape from the first pattern on a second printing roll using a second printing plate, wherein the second printing roll being different from the first printing roll and the second printing plate is different from the first printing plate;
    sequentially rotating the first printing roll on the metal layer to transfer the first pattern onto the metal layer and rotating the second printing roll on the first pattern to transfer the second pattern onto the first pattern to form a masking pattern having a step difference on the metal layer;
    etching the semiconductor layer and the metal layer using the masking pattern as a etch mask; and
    removing the pattern.

5. The method according to claim 4, wherein forming the first pattern and forming the second pattern further comprises coating pattern material on the first and second printing rolls using respective first and second printing devices.

6. The method according to claim 4, wherein forming the first pattern and forming the second pattern comprises sequentially rotating the first and second printing rolls on first and second printing plates, respectively, such that the first pattern is transferred onto the first printing roll and the second pattern is transferred onto the second printing roll.

* * * * *